(12) United States Patent
Suh

(10) Patent No.: US 8,621,324 B2
(45) Date of Patent: Dec. 31, 2013

(54) EMBEDDED DRAM HAVING LOW POWER SELF-CORRECTION CAPABILITY

(75) Inventor: Jungwon Suh, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 287 days.

(21) Appl. No.: 12/964,761

(22) Filed: Dec. 10, 2010

(65) Prior Publication Data

US 2012/0151299 A1 Jun. 14, 2012

(51) Int. Cl.
*G06F 11/00* (2006.01)

(52) U.S. Cl.
USPC .......................................... 714/764

(58) Field of Classification Search
USPC ............. 714/704, 708, 718, 723, 764, 766
See application file for complete search history.

(56) References Cited

U.S. PATENT DOCUMENTS

| | | | |
|---|---|---|---|
| 5,956,350 A * | 9/1999 | Irrinki et al. ............... | 714/718 |
| 7,392,456 B2 | 6/2008 | Leung | |
| 7,523,380 B1 * | 4/2009 | Trimberger ................ | 714/763 |
| 2003/0135794 A1 * | 7/2003 | Longwell et al. ........... | 714/42 |
| 2004/0205426 A1 * | 10/2004 | Muranaka et al. .......... | 714/704 |
| 2005/0281112 A1 * | 12/2005 | Ito et al. .................. | 365/222 |
| 2007/0079212 A1 * | 4/2007 | Har-Chen et al. ........... | 714/758 |
| 2007/0133315 A1 * | 6/2007 | Kang et al. ............... | 365/189.05 |
| 2007/0230265 A1 | 10/2007 | Riho et al. | |
| 2008/0092016 A1 | 4/2008 | Pawlowski | |
| 2008/0222483 A1 | 9/2008 | Ito | |
| 2009/0204752 A1 | 8/2009 | Sasaki | |
| 2009/0249169 A1 | 10/2009 | Bains | |
| 2010/0054070 A1 | 3/2010 | Klein | |
| 2010/0106901 A1 * | 4/2010 | Higeta et al. ............. | 711/106 |
| 2012/0221905 A1 * | 8/2012 | Burger et al. ............. | 714/723 |
| 2012/0246544 A1 * | 9/2012 | Resnick et al. ............ | 714/764 |

OTHER PUBLICATIONS

International Search Report and Written Opinion—PCT/US2011/064303—ISA/EPO—Apr. 3, 2012.

* cited by examiner

*Primary Examiner* — Marc Duncan
(74) *Attorney, Agent, or Firm* — Sam Talpalatsky; Nicholas J. Pauley; Joseph Agusta

(57) ABSTRACT

Apparatuses and methods for low power combined self-refresh and self-correction of a Dynamic Random Access Memory (DRAM) array. During a self-refresh cycle, a first portion of a first row of the DRAM array is accessed and analyzed for one or more errors, wherein a bit width of the first portion is less than a bit width of the first row. If one or more errors are detected, the one or more errors are corrected to form a corrected first portion. The corrected first portion is selectively written back to the first row. If no errors are detected in the first portion, a write back of the first portion to the first row is prevented.

57 Claims, 6 Drawing Sheets

CONVENTIONAL
DRAM CELL

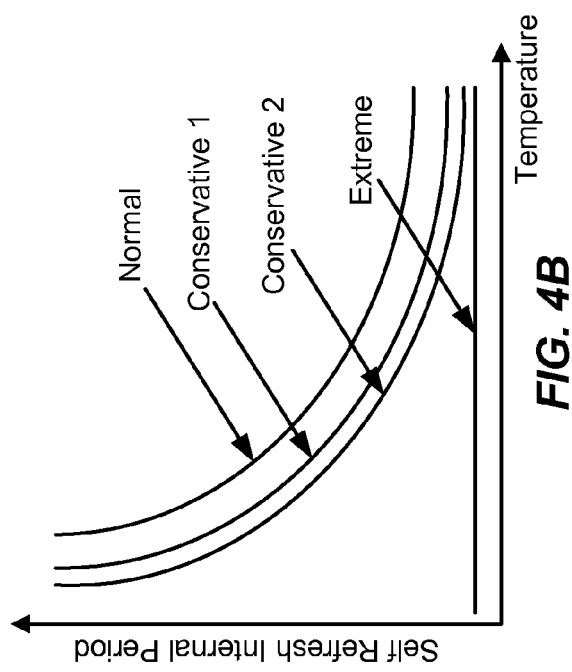
FIG. 4B
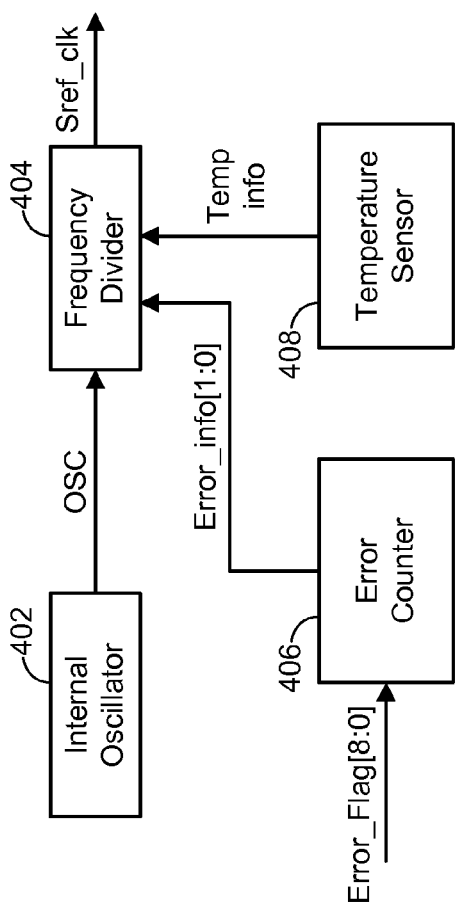
FIG. 4A
| Error_info[1:0] | Accumulated Error # | SREF Mode |
|---|---|---|
| 00 | 0 ~ 4 | Normal |
| 01 | 5 ~ 16 | Conservative 1 |
| 10 | 17 ~ 32 | Conservative 2 |
| 11 | > 32 | Extreme |
FIG. 4C

EMBEDDED DRAM HAVING LOW POWER SELF-CORRECTION CAPABILITY

FIELD OF DISCLOSURE

Disclosed embodiments are directed to Dynamic Random Access Memory (DRAM). More particularly, exemplary embodiments are directed to embedded DRAMs with low power self-correction capability.

BACKGROUND

DRAM systems provide low-cost data storage solutions because of the simplicity of their construction. Essentially, DRAM cells are made up of a switch/transistor and a capacitor to store information in terms of charge. Therefore, the construction of DRAM cells is simple, requires much less area as compared to Static Random Access Memory (SRAM) cells, and amenable to high density integration in memory arrays and embedded systems. However, because capacitors are leaky, the charge stored in capacitors, needs to be periodically refreshed in order to retain the stored information correctly. The need for periodic and frequent refresh of the DRAM cells consumes considerable power, and renders DRAM systems unattractive for low power applications, in spite of their low cost.

Refresh operations on DRAM cells are power hungry because each time a single DRAM cell in a DRAM array needs to be refreshed, the entire row wherein the cell resides, is read out and then written back. The DRAM cells are automatically refreshed when they are read out/written back during memory read/write operations. However, the DRAM cells must be refreshed with a certain minimum frequency in order to ensure that errors are not introduced. Therefore, when memory read/writes operations do not occur within a certain period of time since the DRAM cells were last refreshed, or when the system is in a standby mode, a DRAM controller may be used to monitor the refresh rates and perform refresh cycles at the required frequency. Performing a refresh using a DRAM controller, outside of regular memory read/write operations, is also known as "self-refresh."

Normally, in self-refresh mode, each row of a DRAM array is taken through a read out and write back process in sequence, over the course of a refresh cycle. Each of these read out and write back processes fire up word lines, a pair of complementary bit lines, sense amplifiers, etc. The minimum frequency at which refresh cycles may need to be scheduled in order to minimize errors, is usually in the order of several thousand refresh cycles per second.

Errors which may occur in DRAM arrays may be classified broadly as soft errors and hard errors. Soft errors are caused due to radioactive contaminants introduced during packaging of the embedded DRAM systems, cosmic rays, thermal neutrons, etc. Soft errors are also susceptible to the temperature of operation of the DRAM systems, such that errors are more likely at higher temperatures. Soft errors, if detected in a DRAM cell, can be rectified by just rewriting the correct data back to the DRAM cell. However, hard errors are physical defects, and may be attributable to, say, manufacturing defects. Hard errors are usually difficult to rectify.

Commonly used techniques for error detection and error correction include the use of error-correcting code (ECC) bits. ECC bits are introduced into the DRAM array as additional information, such as parity data, relating to the data stored in the DRAM array. One or more ECC bits are usually computed for each data segment, such as a byte of data, in the DRAM array. The ECC bits may be stored alongside the data in the DRAM array. When a row of data, comprising several data segments, is read out of the DRAM array, the corresponding ECC bits are read out as well. Error detection may be performed on each of the data segments within a row, using the corresponding ECC bits. If errors are detected in one or more data segments, known techniques may be used to correct the errors, and the entire row comprising correct data segments is written back to the DRAM array.

Error detection and correction in the manner described above may be performed at the direction of a processor or CPU coupled to an embedded DRAM system. As can be seen, error detection and correction also involves read out and write back operations to be performed on the DRAM array. Therefore, error detection and correction may be combined with regular read/write operations to memory as initiated by a CPU or other bus master. However, integrating this aspect of error detection and correction with regular read/write operations results in stretching the latency required for these read/write operations, which may be unacceptable in high performance systems.

Error detection and correction may also be self governed within a DRAM system, which is sometimes referred to as "self-correction." Usually, self-correction and self-refresh are performed as separate operations. Therefore, each of these self-refresh and self-correction operations end up consuming power associated with read out and write back to the DRAM array. Some techniques attempt to tailor the frequency of self-correction based on likelihood of errors for known frequencies of self-refresh. However, even with such solutions, power consumption associated with each self-correction and self-refresh operation is not reduced. As is well known, the associated high power consumption is a serious drawback, especially for embedded systems and battery powered devices.

There is, accordingly, a need in the art for minimizing the power consumption of DRAM arrays incurred during the various memory read/write operations, refresh operations and error detection and correction operations.

SUMMARY

Exemplary embodiments are directed to systems and method for low power combined self-refresh and self-correction of a Dynamic Random Access Memory (DRAM) array.

For example, an exemplary embodiment is directed to method of accessing a Dynamic Random Access Memory (DRAM) array comprising accessing a first portion of a first row of the DRAM array, and analyzing the first portion for one or more errors, wherein a bit width of the first portion is less than a bit width of the first row. If one or more errors are detected, correcting the one or more errors to form a corrected first portion, and selectively writing back the corrected first portion to the first row. If no errors are detected, preventing a write back of the first portion to the first row.

Another exemplary embodiment is directed to a Dynamic Random Access Memory (DRAM) array comprising a first row, and logic to detect one or more errors in a first portion of the first row, wherein a bit width of the first portion is less than a bit width of the first row. If errors are detected in the first portion, logic to correct the errors, in order to form a corrected first portion, and logic to selectively write back the corrected first portion to the first row. If no errors are detected, logic to prevent write back of the first portion to the first row.

Yet another exemplary embodiment is directed to A Dynamic Random Access Memory (DRAM) array comprising: means for accessing a first portion of a first row of the DRAM array, and means for analyzing the first portion for one or more errors, wherein a bit width of the first portion is less than a bit width of the first row. If one or more errors are detected, means for correcting the one or more errors to form a corrected first portion and means for selectively writing back the corrected first portion to the first row. If no errors are detected, means for preventing write back of the first portion to the first row.

Similarly, another exemplary embodiment is directed to non-transitory computer-readable storage medium comprising code, which, when executed by a processor, causes the processor to perform operations for accessing a Dynamic Random Access Memory (DRAM) array, the non-transitory computer-readable storage medium comprising code for accessing a first portion of a first row of the DRAM array, and code for analyzing the first portion for one or more errors, wherein a bit width of the first portion is less than a bit width of the first row. If one or more errors are detected, code for correcting the one or more errors to form a corrected first portion and code for selectively writing back the corrected first portion to the first row. If no errors are detected, code for preventing a write back of the first portion to the first row.

Yet another exemplary embodiment is directed to method of accessing a Dynamic Random Access Memory (DRAM) array comprising step for accessing a first portion of a first row of the DRAM array and step for analyzing the first portion for one or more errors, wherein a bit width of the first portion is less than a bit width of the first row. If one or more errors are detected, step for correcting the one or more errors to form a corrected first portion and step for selectively writing back the corrected first portion to the first row. If no errors are detected, step for preventing a write back of the first portion to the first row.

BRIEF DESCRIPTION OF THE DRAWINGS

The accompanying drawings are presented to aid in the description of the various embodiments and are provided solely for illustration of the embodiments and not limitation thereof.

FIGS. 4A-C illustrate systems and methods for tracking errors in DRAM arrays for different operating temperatures and determining a frequency for performing self-refresh/self-correction operations in exemplary embodiments, for particular operating temperatures

DETAILED DESCRIPTION

Figure 1:
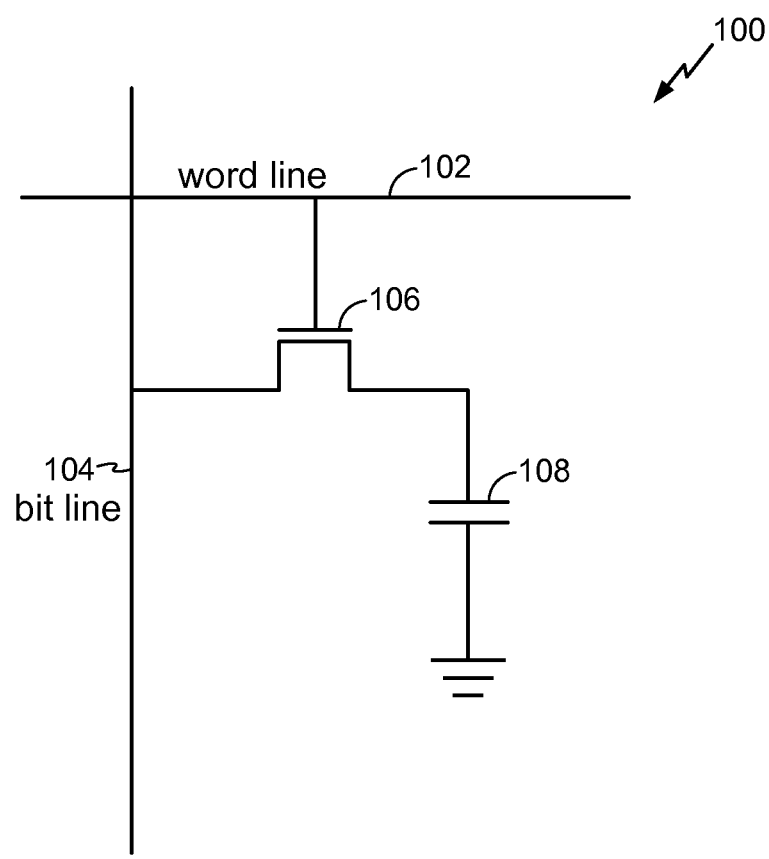
FIG. 1 is a schematic illustration of a conventional DRAM cell

Aspects of the invention are disclosed in the following description and related drawings directed to specific embodiments. Alternate embodiments may be devised without departing from the scope of the invention. Additionally, well-known elements of the various embodiments will not be described in detail or will be omitted so as not to obscure the relevant details of the various embodiments discussed herein.

The word "exemplary" is used herein to mean "serving as an example, instance, or illustration." Any embodiment described herein as "exemplary" is not necessarily to be construed as preferred or advantageous over other embodiments. Likewise, the term "embodiments" or "embodiments of the invention" does not require that all embodiments include the discussed feature, advantage or mode of operation.

The terminology used herein is for the purpose of describing particular embodiments only and is not intended to be limiting of the various embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In general, exemplary embodiments are directed a DRAM system with low power self-refresh and self-correction capabilities. Unlike conventional DRAM systems, self-refresh and self-correction operations can be integrated into a combined operation requiring reduced read and write accesses into a DRAM array of the DRAM system. A combined self-refresh and self-correction can be performed separate from regularly scheduled read and write operations directed by a CPU or other bus master, thereby ensuring that latencies of these regularly scheduled read and write operations are not affected.

Moreover, partial write back operations can be selectively performed during self-correction, such that write back of data is prevented if no error is detected in a certain row of the DRAM array. Further, the write back operation can be segmented such that only data segments requiring correction need to be written back to the DRAM array, thus saving power on unnecessary write back of data segments which require no correction. Accordingly, as will be seen in further detail below, fine tuned logic for parsing through columns of data segments in the DRAM array can be used in addition to row decoders for stepping through each row of the DRAM array during self-refresh and self-correction operations.

Exemplary embodiments can also monitor the temperature at which the DRAM system is operated, and thereby determine an appropriate frequency for performing self-refresh and self-correction operations based on the temperature of operation.

It will be understood that while embodiments are described with reference to embedded DRAM arrays, disclosed systems and techniques are not limited to embedded DRAM systems, but can be easily extended to standalone DRAM systems, as well as other implementations of DRAM devices.

The exemplary DRAM system is now described with reference to FIGS. 1-5. FIG. 1 illustrates a conventional DRAM cell 100, comprising transistor 106 and capacitor 108. The transistor 106 is turned on when word line 102 is activated, and conducts the information on bit line/column line 104 to the capacitor 108. Thereafter, the information is stored in capacitor 108.

Figure 2:
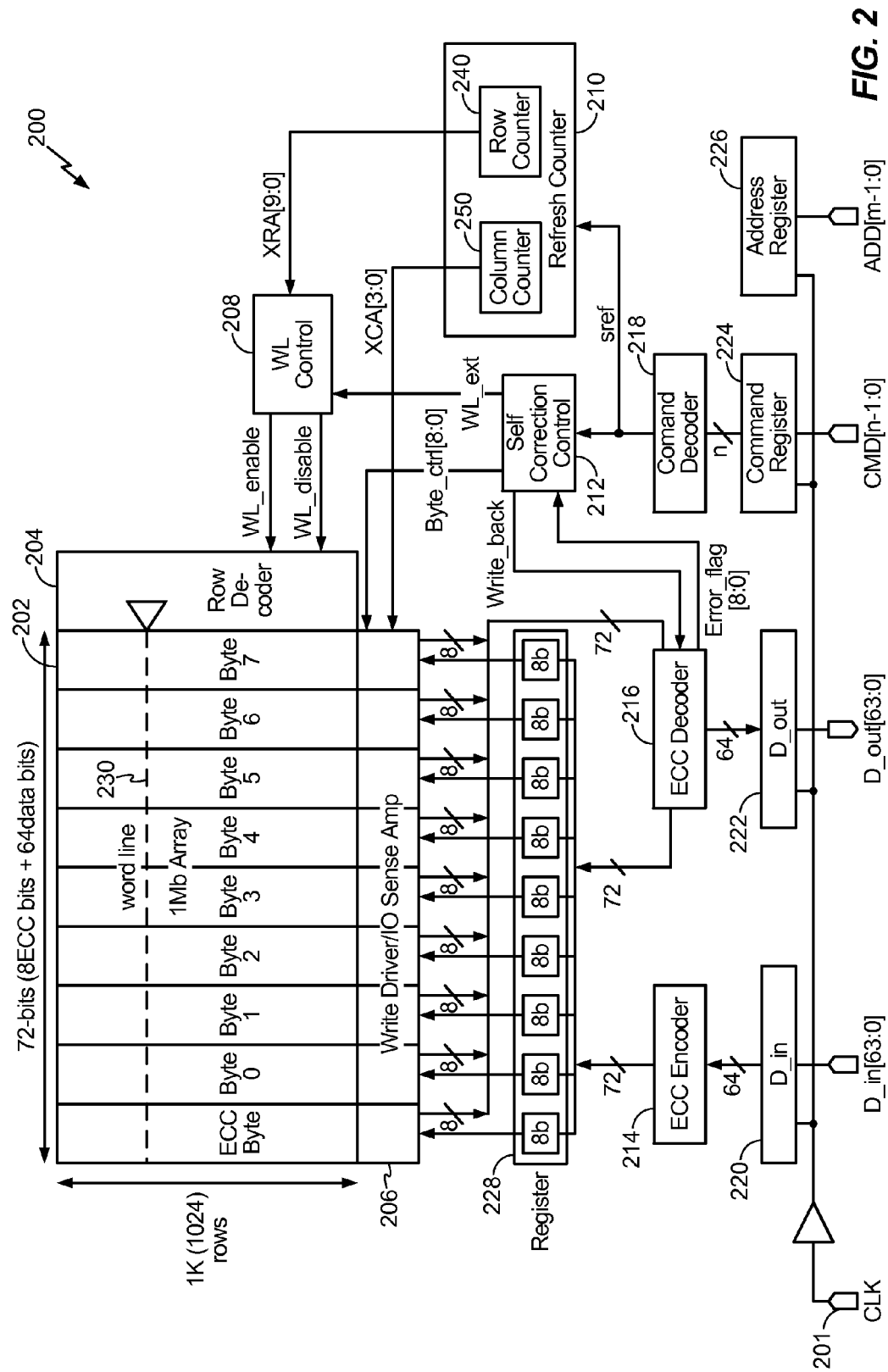
FIG. 2 illustrates a DRAM system capable of implementing low power self-refresh and self-correction, according to disclosed embodiments.

With reference to FIG. 2, there is shown an embedded DRAM system 200. DRAM system 200 comprises DRAM array 202, formed of DRAM cells such as DRAM cell 100. In an illustrative example, DRAM array 202 will be described as comprising 64-bits or eight bytes of data, byte0-byte7, with one ECC bit added for each byte of data, in each row. The DRAM array 202 comprises 1K (1024) such rows. However, the disclosed embodiments are not to be construed as limited in any way to particular data sizes or ECC bits. For example, DRAM array 202 may be part of a larger DRAM array, such as a 1 MB array comprised of 16 arrays such as DRAM array 202, such that a row of the 1 MB DRAM array has word lines of data size 1 KB (64-bits×16) and 1K (1024) such word lines. The size of the 1 MB array is appropriately expanded to include 8 ECC bits for every 64-bits or eight bytes of data.

As shown in FIG. 2, the eight ECC bits may be stored as one ECC byte alongside the eight data bytes, byte0-byte7 within DRAM array 202. The eight bytes of data may be received from an external source such as a CPU or other bus master and stored temporarily in input register D_in 220. The ECC byte may be computed by ECC encoder 214. The 72-bit field comprising the ECC byte along with eight data bytes, byte0-byte7, may then be written into DRAM array 202 through the use of write driver/IO sense amplifier 206.

Row decoder 204 may be configured to activate a particular word line within DRAM array 202, by decoding the 10-bit field, XRA[9:0]. 1024 or 1K word lines may be encoded by the field, XRA[9:0]. In order to save power, and prevent unnecessary toggling, activation of word lines may be gated by word line control logic, WL control 208. Refresh counter 210 comprises a row counter 240. Row counter 240 may be configured to step through the values 0 to 1023, encoded in XRA[9:0], in order to activate each word line in DRAM array 202 in sequence, over a refresh cycle. Command register 224 may receive instructions from a CPU or other bus master, and transfer the same to command decoder 218. Command decoder 218 may thereafter direct refresh counter 210 to perform in a self-refresh mode using the command "sref" wherein refresh counter 210 essentially operates to cause row counter 240 to step through each word line of the 1024 word lines, per self-refresh cycle. Alternately, command decoder 218 may direct refresh counter 210 to activate particular word lines based on instructions received at command register 224, and row address as derived from address register 226.

With combined reference to FIGS. 1-2, activating word line 230 effectively activates transistor 106 of each DRAM cell 100 coupled to word line 230. The operation leading to activation of a word line is common to both read and write operations. Usually, a refresh operation on word line 230 would involve reading out from capacitor 108 of each DRAM cell 100 coupled to word line 230, through activated transistor 106, column line 104 and write driver/IO sense amp 206; storing the data in a temporary storage register; and writing the data back from the temporary storage register, through column 104 and activated transistor 106 into capacitor 108. The word line 230 is held high throughout this refresh operation. As described in further detail below, exemplary embodiments depart from this usual refresh operation, in that while the word line 230 is activated, a self-correction process is also integrated into the refresh operation, before data is written back into the DRAM array 202 at the end of the refresh cycle. Exemplary embodiments also depart from the usual refresh operation, in that data is only selectively written back into the DRAM array 202 in smaller segments than the entire word line 230. Further, only data segments in which errors may be detected may be configured to be written back, in order to save power.

Referring now to FIG. 2, refresh counter 210 also comprises column counter 250 for stepping through columns of DRAM array 202. Column counter 250, may be configured to step through nine byte-sized columns including the ECC byte and eight data bytes, byte0-byte7, using the encoded bits XCA[3:0]. Write driver/IO sense amp 206 may be configured to enable reading out one byte at a time from word line 230, based on a column address for a particular byte, as indicated by XCA[3:0]. The ECC byte may be read out first, and stored separately for use in conjunction with the data bytes, byte0-byte7. Alternately, all nine bytes on word line 230 may be read out at the same time by configuring the write driver/IO sense amp 206 appropriately.

Once the ECC byte and data bytes, byte0-byte7, are read out, they are sent to ECC decoder 216. ECC decoder 216 is configured to detect errors, if any, in each data byte, byte0-byte7, using a corresponding ECC bit from the ECC byte. Known techniques may be used for performing error detection using ECC bits. If an error is detected in any of the eight data bytes, byte0-byte7, ECC decoder 216 may flag the byte which contains an error, using the signal error_flag[8:0]. Each bit in error_flag[8:0] may index to a particular data byte, byte0-byte7, to indicate that an error was detected in that particular data byte.

The logic block, self correction control 212 generally monitors the process of error correction. Self correction control 212 may be controlled by command decoder 218 based on instructions received at command register 214, or self correction control 212 may be configured to operate in a more autonomous manner to perform self correction during a self-refresh operation. The same command, "sref" that is sent to refresh counter 210 may be used to direct self correction control 212 to perform self-correction during a self-refresh mode. In an embodiment, while word line 230 is still held high during a self-refresh operation, self correction control 212 may receive the signal, error_flag[8:0] from ECC decoder 216. Based on which bytes of byte0-byte7, if any, were flagged as containing an error, self correction control 212 may initiate a selective correction and write back process on the particular bytes which may have an error.

For example, if byte0 was flagged as containing an error, by asserting an appropriate bit, say error_flag[0], in the signal error_flag[8:0], then self correction control 212 generates the signal byte_ctrl[8:0], with only byte_ctrl[0] asserted, to indicate that only byte0 needs to be written back into word line 230, after byte0 has been corrected. Known techniques for correcting the errors detected using ECC bits may be employed, and will not be described in detail here. In an embodiment, ECC decoder 216 may be configured to correct the error in byte0, upon receiving a write_back signal from self correction control 212, indicating that at least one byte needs to be written back. If on the other hand, ECC decoder 216 had previously detected no errors in any of the eight data bytes, byte0-byte7, all bits of error_flag [8:0] would be de-asserted to indicate no errors in any data byte, and self correction control 212 would de-assert (or maintain at a de-asserted state), the write_back signal, to indicate that no write back operation needs to be performed. The signal byte_ctrl [8:0] would also disable the write back for all bytes in this case. In other words, write back operation is only performed on data bytes which may contain an error, and if no error is detected in any of the data bytes, then none of the data bytes are written back in the self-correction process.

In exemplary embodiments, the output of the ECC decoder 216 comprising correct data (corrected, if an error was detected, and unchanged if no error was detected), may be stored in a temporary register 228, and then written back into word line 230 through write driver/IO sense amp 206, under the control of byte_ctrl[8:0]. Write driver/IO sense amp 206 is appropriately configured to enable write back of data in byte-size segments. As can be seen, only a data byte which may comprise an error will be corrected and written back during the combined self-refresh and self-correction operation. Once write back, if any, is completed, word line 230 is de-asserted. Refresh counter 210 directs row counter 240 to increment to the next row of DRAM array 202, and the process is repeated till all 1024 rows are taken through a combined self-refresh and self-correction operation. It will be understood servicing external read requests may also be integrated into the above process, by extracting the data from ECC decoder 216, and reading the data out of the DRAM system using the register, D_out 222. The timing for the various processes may be sourced from a system clock, such as clk 201.

Figure 3:
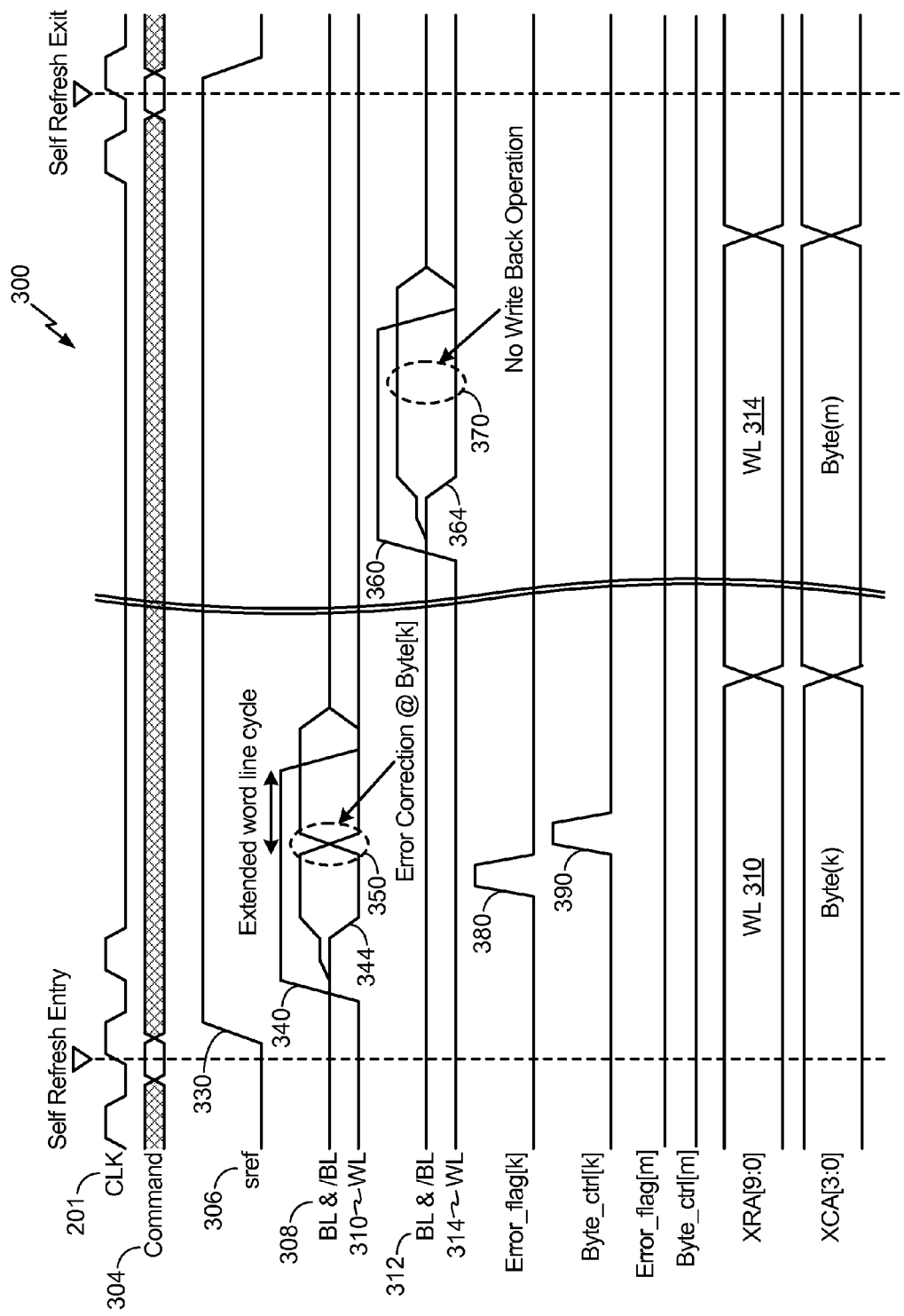
FIG. 3 is a timing diagram illustrating the timing relationship between the various processes involved in self-refresh/self-correction operations in exemplary embodiments.

With reference now to FIG. 3, there is shown a schematic timing diagram detailing the timing relationship between the various processes described above with respect to self-refresh and self-correction. In timing diagram 300, selected cycles of the system clock, clk 201 are shown. A command 304 is received from command decoder 218. At time instant 330, the command sref 306 is asserted, essentially activating a combined self-refresh and self-correction operation. In an illustrated example, word line WL 310 is selected through XRA [9:0] at time instant 340. At that time, byte[k] of the eight data bytes in word line 310 is highlighted by the signal XCA[3:0]. Soon after, bit lines BL & /BL 308 are activated at time 344 in order to read a particular bit of byte[k]. ECC decoder 216 receives byte[k] and detects that byte[k] comprises an error on the bit selected by BL & /BL 308, which is flagged to self correction control 212, by asserting the bit, error_flag[k] at time 380. Self correction control 212 asserts the signal write-_back (not shown), and error decoder 216 then corrects the error and stores a corrected value of byte[k] in register 228. At time 390, self correction control 212 asserts byte_ctrl[k], in order to allow the corrected value of byte[k] stored in register 228, to be written back to word line 310 through write driver/ IO sense amp 206. At time 350, the error in byte[k] is corrected, as illustrated by the change in values of bit lines BL & /BL 308. Thus is illustrated the operation of a self-correction when an error is detected, during a self-refresh.

With continuing reference to FIG. 3, also illustrated is the operation of disclosed embodiments when no error is detected. At time 360, a refresh cycle is continued to be in effect, and word line WL 314 is selected through XRA[9:0]. Bit lines BL & /BL 312 of byte[m] (selected by XCA[3:0]) are activated at time 364 to read out bits of byte[m]. However, in this case, error decoder 216 does not detect any errors in byte[m]. Therefore, no error is flagged through the signal error_flag[m], and therefore, corresponding write_back and byte_ctrl[m] are not asserted, and subsequently, no write back is performed at time 370. Thus, useless write back activity is avoided, because it is determined that no errors are detected. If at a later point in time, during a different cycle, an error is detected in byte[m], then byte[m] is corrected and also refreshed at the same time.

Accordingly, with continuing reference to FIG. 3, exemplary embodiments include method of accessing a DRAM array comprising: accessing a first portion (e.g. byte[k]) of a first row (e.g., word line WL 310) of the DRAM array, wherein a bit width of the first portion is less than a bit width of the first row; analyzing the first portion for one or more errors; correcting the one or more errors to form a corrected first portion (e.g. corrected value of byte[k] stored in register 228) if one or more errors are detected; and selectively writing back the corrected first portion to the first row.

It will be seen that, exemplary embodiments deliver significant power savings by preventing unnecessary expensive write back operations into DRAM array 202. Further, embodiments combine the two operations of self-refresh and self-correction in DRAM array into an efficiently integrated operation wherein read out and write back, if any, are shared. Power savings are also mined from segmenting each word line and performing a selective write back. It will be appreciated that disclosed techniques incur very little hardware overhead and do not affect the latencies of regular read/write operations scheduled on the DRAM arrays by a CPU or other bus master, because the combined self-refresh and self-correction operations are performed independent of such regular read/write operations.

A further embodiment is now described for tailoring frequency of self-refresh and self-correction operations to temperature of operation of the embedded DRAM system 200. It is advantageously recognized that operating temperature can play a significant role in the frequency of occurrence of errors in DRAM array 202. In general, the number of errors is likely to increase with an increase in operating temperature. Data mined from error_flag[8:0] over a large number of self-refresh/self-correction cycles, by varying the operating temperature, can reveal a statistic relationship between the number of errors and temperature. Once the number of errors likely to occur at a certain temperature has been determined, an optimal frequency of performing self-refresh/self-correction operations in order to minimize errors can be determined at that temperature. It is recognized that different systems are differently prone to errors at a given operating temperature.

With reference now to FIGS. 4A-C, intelligent systems are illustrated to optimally tailor the frequency of self-refresh/ self-correction cycles to the operating temperature. For example, FIG. 4C illustrates a table, classifying DRAM systems based on their susceptibility to errors. The signal, error-_info[1:0] is determined from error_flag[8:0], and broadly classifies DRAM systems into four categories based on the number of errors at a given operating temperature. In the example of FIG. 4C, 0-4 errors is classified as a "normal" SREF mode. The SREF mode relates to the frequency at which self-refresh/self-correction cycles need to be performed in order to minimize errors. Similarly, the table of FIG. 4C classifies SREF modes as "conservative 1," "conservative 2," and "extreme" based on the number of errors as indicated by error_info[1:0].

Each SREF mode relates to a particular frequency at a given temperature, which can be appropriately determined from the graph of FIG. 4B. With reference to FIG. 4B, there is shown a graph illustrating the relationship between a self refresh internal period and temperature for each SREF mode.

A corresponding self-refresh/self-correction frequency can be determined as the inverse of the self refresh internal period.

With reference now to FIG. 4A, there is shown a system for adjusting the frequency of self-refresh/self-correction cycles on DRAM system 200 from FIG. 2, based on the information obtained from FIGS. 4B-C. Error counter 406 outputs error_info[1:0] by accumulating and studying error_flag[8:0] over a large predetermined number of cycles of self-refresh/self-correction. Temperature sensor 408 determines the operating temperature of DRAM system 200. Internal oscillator 402 provides a base line frequency, which may be adjusted by frequency divider 404. Frequency divider 404 receives error_info[1:0], and the operating temperature from error counter 406 and temperature sensor 408 respectively, and based on the table of FIG. 4C and graph of FIG. 4B, determines the frequency for performing self-refresh/self-correction cycles on DRAM system 200. This information is then translated to the clock 201 of FIG. 2, to appropriately control the self-refresh/self correction cycles of DRAM system 200.

Figure 5:
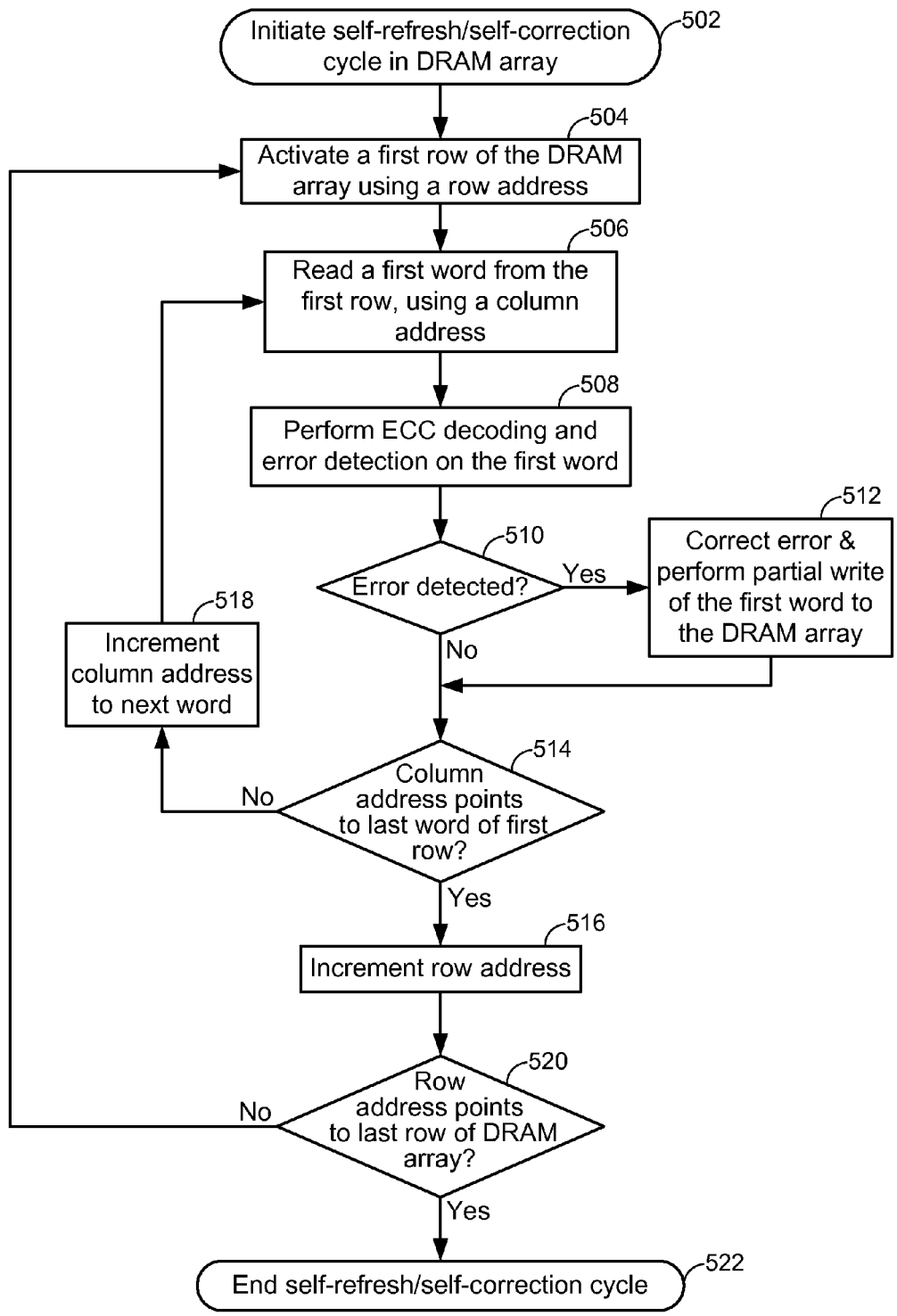
FIG. 5 is a flow chart illustration of the sequence of operations performed in an exemplary method of performing self-refresh/self-correction operations in an exemplary DRAM array.

It will be appreciated that embodiments include various methods for performing the processes, functions and/or algorithms disclosed herein. For example, as illustrated in FIG. 5, an embodiment can include a method of initiating a self-refresh/self-correction cycle in a DRAM array (Block 502). Through the use of a row counter, for example, a row address for a first row determined, and the first row is activated (Block 504). Next, through the use of a column counter, for example, a column address is determined, and a first word is read from the activated first row using the column address, wherein a word may comprise one or more bytes (Block 506). ECC decoding and error detection is performed on the first word, in Block 508. In Block 510, if an error is detected, the method enters Block 512. In Block 512, the error is corrected and a partial write back of the first word is performed to its original location, and the method continues to Block 514. If no error is detected in block 510, no write back is performed, and the method enters Block 514. At Block 514, the column address is checked to see if it is pointing to the last word of the first row. If at Block 514, it is determined that the last word of the first row is not reached, then the column address is increased to point to the next word of the first row, in Block 518, and the method is repeated from Block 506. If at Block 514, it is determined that the last word of the first row is reached, then the row address is incremented at Block 516. At Block 520, it is determined whether the last row of the DRAM array is reached, and if not, the method repeats from Block 504. If at Block 520, it is determined that the last row address is reached, then the self-refresh/self-correction cycle started at Block 502 comes to an end in Block 522.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment can include a computer readable media embodying a method for accessing a DRAM array and performing low power self-correction by integrating a self-correction operation within a self-refresh cycle. Accordingly, the various embodiments are not limited to illustrated examples and any means for performing the functionality described herein are included in various embodiments.

Figure 6:
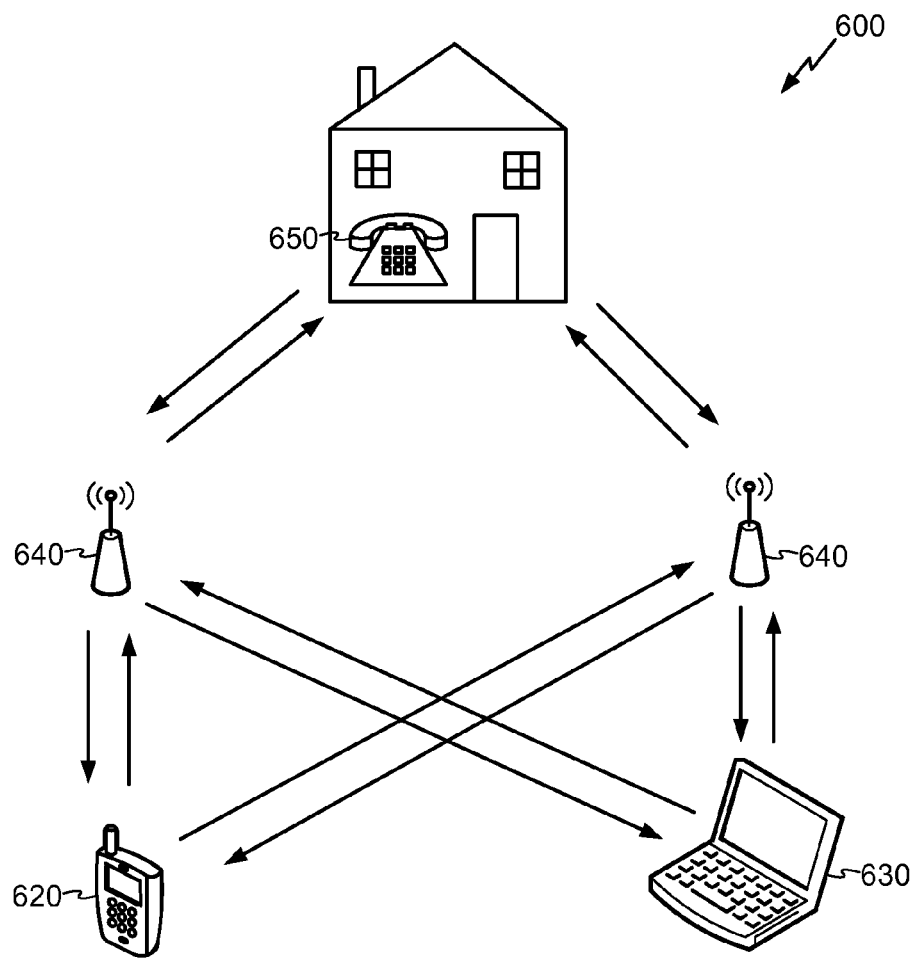
FIG. 6 is a block diagram showing an exemplary wireless communication system in which embodiments of the disclosure may be advantageously employed.

FIG. 6 illustrates an exemplary wireless communication system 600 in which an embodiment of the disclosure may be advantageously employed. For purposes of illustration, FIG. 6 shows three remote units 620, 630, and 650 and two base stations 640. In FIG. 6, remote unit 620 is shown as a mobile telephone, remote unit 630 is shown as a portable computer, and remote unit 650 is shown as a fixed location remote unit in a wireless local loop system. For example, the remote units may be mobile phones, hand-held personal communication systems (PCS) units, portable data units such as personal data assistants, GPS enabled devices, navigation devices, settop boxes, music players, video players, entertainment units, fixed location data units such as meter reading equipment, or any other device that stores or retrieves data or computer instructions, or any combination thereof. Although FIG. 6 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative embodiments, it should be noted that various changes and modifications could be made herein without departing from the scope of the invention as defined by the appended claims. The functions, steps and/or actions of the method claims in accordance with the various embodiments described herein need not be performed in any particular order. Furthermore, although elements of the various disclosed embodiments may be described or claimed in the singular, the plural is contemplated unless limitation to the singular is explicitly stated.

What is claimed is:

1. A method of accessing a Dynamic Random Access Memory (DRAM) array comprising:

accessing a first portion of a first row of the DRAM array, wherein a bit width of the first portion is less than a bit width of the first row;
analyzing the first portion for one or more errors;
correcting the one or more errors to form a corrected first portion if one or more errors are detected; and
selectively writing back the corrected first portion to the first row.

2. The method of claim 1, wherein if no errors are detected in the first portion, preventing a write back of the first portion.

3. The method of claim 1, wherein accessing the DRAM array comprises accessing a self-refresh operation during a first time period.

4. The method of claim 3, wherein a self-correction operation is performed in the first time period.

5. The method of claim 1, further comprising storing error-correcting code (ECC) bits associated with the first portion in the first row, and detecting an error in the first portion, using the ECC bits.

6. The method of claim 5, wherein the first portion comprises 8 bits of data, and wherein 1 ECC bit is associated with the first portion, such that the first row comprises 8 ECC bits and 64 bits of data.

7. The method of claim 1, further comprising:
associating column addresses with portions of the first row;
updating the column address to point to a second portion of the first row; accessing the second portion;
analyzing the second portion for one or more errors and if errors are detected correcting the one or more errors to form a corrected second portion; and
selectively writing back the corrected second portion to the first row.

8. The method of claim 7, repeated for all portions of the first row.

9. The method of claim 8, repeated for all rows of the DRAM array.

10. The method of claim 1, further comprising, tracking a number of errors detected in the DRAM array during a tracking period, and determining an optimum frequency of accessing the DRAM array based on the number of errors detected during the tracking period.

11. The method of claim 10, further comprising tracking the number of errors for a particular operating temperature, and determining the optimum frequency for the particular operating temperature.

12. The method of claim 1, wherein the DRAM array is integrated into a device, selected from the group consisting of a set top box, music player, video player, entertainment unit, navigation device, communications device, personal digital assistant (PDA), fixed location data unit, and a computer.

13. A Dynamic Random Access Memory (DRAM) array comprising:
a first row;
logic to detect one or more errors in a first portion of the first row, wherein a bit width of the first portion is less than a bit width of the first row;
logic to correct errors if errors are detected in the first portion, in order to form a corrected first portion; and
logic to selectively write back the corrected first portion to the first row.

14. The DRAM array of claim 13, further comprising logic to prevent a write back of the first portion if no errors are detected in the first portion.

15. The DRAM array of claim 13, comprising logic to perform a self-refresh operation during a first time period.

16. The DRAM array of claim 15, further comprising logic to perform a self-correction operation during the first time period.

17. The DRAM array of claim 13, further comprising error-correcting code (ECC) bits associated with the first portion, wherein the ECC bits are stored in the first row and are used to perform error detection on the first portion.

18. The DRAM array of claim 17, wherein the first portion comprises 8 bits of data, and wherein 1 ECC bit is associated with the first portion, such that the first row comprises 8 ECC bits and 64 bits of data.

19. The DRAM array of claim 13, further comprising, column addresses associated with portions of the first row;
logic to step through column addresses corresponding to the portions of the first row;
logic to perform error detection on each of the portions;
logic to perform error correction if errors are detected in the portions in order to form corrected portions; and
logic to selectively write back the corrected portions to the first row.

20. The DRAM array of claim 19, further comprising logic to step through each row of the DRAM array.

21. The DRAM array of claim 13, further comprising logic to track a number of errors detected in the DRAM array during a tracking period, and logic to determine an optimum frequency of accessing the DRAM array based on the number of errors detected during the tracking period.

22. The DRAM array of claim 21, further comprising logic to track the number of errors for a particular operating temperature, and logic to determine the optimum frequency for the particular operating temperature.

23. The DRAM array of claim 13 integrated in at least one semiconductor die.

24. The DRAM array of claim 13, integrated into a device, selected from the group consisting of a set top box, music player, video player, entertainment unit, navigation device, communications device, personal digital assistant (PDA), fixed location data unit, and a computer.

25. A Dynamic Random Access Memory (DRAM) array comprising:
means for accessing a first portion of a first row of the DRAM array, wherein a bit width of the first portion is less than a bit width of the first row;
means for analyzing the first portion for one or more errors;
if one or more errors are detected, means for correcting the one or more errors to form a corrected first portion; and
means for selectively writing back the corrected first portion to the first row.

26. The DRAM array of claim 25, wherein if no errors are detected in the first portion, means for preventing a write back of the first portion.

27. The DRAM array of claim 25, comprising means for performing a self-refresh operation during a first time period.

28. The DRAM array of claim 27, further comprising means for performing a self-correction operation in the first time period.

29. The DRAM array of claim 25, further comprising means for error correction and error detection associated with the first portion in the first row, and stored in the DRAM array.

30. The DRAM array of claim 25, further comprising:
means for associating column addresses with portions of the first row;
means for updating the column address to point to a second portion of the first row;
means for accessing the second portion;

means for analyzing the second portion for one or more errors and if errors are detected means for correcting the one or more errors to form a corrected second portion; and means for selectively writing back the corrected second portion to the first row.

31. The DRAM array of claim 25, further comprising, means for tracking a number of errors detected in the DRAM array during a tracking period, and means for determining an optimum frequency of accessing the DRAM array based on the number of errors detected during the tracking period.

32. The DRAM array of claim 31, further comprising means for tracking the number of errors for a particular operating temperature, and means for determining the optimum frequency for the particular operating temperature.

33. The DRAM array of claim 25 integrated in at least one semiconductor die.

34. The DRAM array of claim 25, integrated into a device, selected from the group consisting of a set top box, music player, video player, entertainment unit, navigation device, communications device, personal digital assistant (PDA), fixed location data unit, and a computer.

35. A non-transitory computer-readable storage medium comprising code, which, when executed by a processor, causes the processor to perform operations for accessing a Dynamic Random Access Memory (DRAM) array, the non-transitory computer-readable storage medium comprising:
code for accessing a first portion of a first row of the DRAM array, wherein a bit width of the first portion is less than a bit width of the first row;
code for analyzing the first portion for one or more errors;
code for correcting the one or more errors to form a corrected first portion, if one or more errors are detected; and
code for selectively writing back the corrected first portion to the first row.

36. The non-transitory computer-readable storage medium of claim 35, further comprising code for preventing a write back of the first portion, if no errors are detected in the first portion.

37. The non-transitory computer-readable storage medium of claim 35, comprising code for performing a self-refresh operation during a first time period.

38. The non-transitory computer-readable storage medium of claim 37, further comprising code for performing a self-correction operation in the first time period.

39. The non-transitory computer-readable storage medium of claim 35, further comprising code for error correction and error detection associated with the first portion in the first row.

40. The non-transitory computer-readable storage medium of claim 35, further comprising:
code for associating column addresses with portions of the first row;
code for updating the column address to point to a second portion of the first row; code for accessing the second portion;
code for analyzing the second portion for one or more errors and if errors are detected, code for correcting the one or more errors to form a corrected second portion; and
code for selectively writing back the corrected second portion to the first row.

41. The non-transitory computer-readable storage medium of claim 35, further comprising, code for tracking a number of errors detected in the DRAM array during a tracking period, and code for determining an optimum frequency of accessing the DRAM array based on the number of errors detected during the tracking period.

42. The non-transitory computer-readable storage medium of claim 41, further comprising code for tracking the number of errors for a particular operating temperature, and code for determining the optimum frequency for the particular operating temperature.

43. The non-transitory computer-readable storage medium of claim 35 integrated in at least one semiconductor die.

44. The non-transitory computer-readable storage medium of claim 35, further comprising a device, selected from the group consisting of a set top box, music player, video player, entertainment unit, navigation device, communications device, personal digital assistant (PDA), fixed location data unit, and a computer, into which the device is integrated.

45. A method of accessing a Dynamic Random Access Memory (DRAM) array comprising:
step for accessing a first portion of a first row of the DRAM array, wherein a bit width of the first portion is less than a bit width of the first row;
step for analyzing the first portion for one or more errors;
step for correcting the one or more errors to form a corrected first portion if one or more errors are detected; and
step for selectively writing back the corrected first portion to the first row.

46. The method of claim 45, wherein if no errors are detected in the first portion, step for preventing a write back of the first portion.

47. The method of claim 45, wherein accessing the DRAM array comprises step for accessing a self-refresh operation during a first time period.

48. The method of claim 47, wherein a self-correction operation is performed in the first time period.

49. The method of claim 45, further comprising step for storing error-correcting code (ECC) bits associated with the first portion in the first row, and step for detecting an error in the first portion, using the ECC bits.

50. The method of claim 49, wherein the first portion comprises 8 bits of data, and wherein 1 ECC bit is associated with the first portion, such that the first row comprises 8 ECC bits and 64 bits of data.

51. The method of claim 45, further comprising:
step for associating column addresses with portions of the first row;
step for updating the column address to point to a second portion of the first row;
step for accessing the second portion;
step for analyzing the second portion for one or more errors and if errors are detected, step for correcting the one or more errors to form a corrected second portion; and
step for selectively writing back the corrected second portion to the first row.

52. The method of claim 51, repeated for all portions of the first row.

53. The method of claim 52, repeated for all rows of the DRAM array.

54. The method of claim 45, further comprising, step for tracking a number of errors detected in the DRAM array during a tracking period, and step for determining an optimum frequency of accessing the DRAM array based on the number of errors detected during the tracking period.

55. The method of claim 54, further comprising step for tracking the number of errors for a particular operating temperature, and step for determining the optimum frequency for the particular operating temperature.

56. A method of accessing a Dynamic Random Access Memory (DRAM) array comprising:
- reading a first row of the DRAM array;
- analyzing a first portion of the first row for one or more errors, wherein a bit width of the first portion is less than a bit width of the first row;
- correcting the one or more errors to form a corrected first portion if one or more errors are detected; and
- selectively writing back only the corrected first portion to the first row.

57. A method of refreshing a Dynamic Random Access Memory (DRAM) array comprising:
- during a refresh operation on a first row of the DRAM array:
  - accessing a first portion of the first row, wherein a bit width of the first portion is less than a bit width of the first row;
  - analyzing the first portion for one or more errors;
  - correcting the one or more errors to form a corrected first portion if one or more errors are detected; and
  - selectively writing back the corrected first portion to the first row.

* * * * *